US007130436B1

(12) United States Patent
Tabata et al.

(10) Patent No.: US 7,130,436 B1
(45) Date of Patent: Oct. 31, 2006

(54) HELMET WITH BUILT-IN SPEAKER SYSTEM AND SPEAKER SYSTEM FOR HELMET

(75) Inventors: Hajime Tabata, Saitama (JP); Mutsumi Katayama, Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 194 days.

(21) Appl. No.: 09/657,803

(22) Filed: Sep. 8, 2000

(30) Foreign Application Priority Data

Sep. 9, 1999 (JP) ................................ 11-255330

(51) Int. Cl.
*H04R 25/00* (2006.01)
*H01L 41/053* (2006.01)

(52) U.S. Cl. ...................... 381/190; 381/173; 310/327; 310/348

(58) Field of Classification Search ................ 381/190, 381/376, 114, 2, 173, 310, 191, 390, 340, 381/370, 455; 310/325, 327, 322, 323.06, 310/324, 326, 348; 2/209, 900
See application file for complete search history.

(56) References Cited

U.S. PATENT DOCUMENTS 2,912,605 A * 11/1959 Tibbetts ...................... 381/173
4,008,408 A * 2/1977 Kodama et al.
4,056,742 A 11/1977 Tibbetts
4,578,613 A 3/1986 Posthuma de Boer et al.
4,820,952 A * 4/1989 Lee ............................ 310/334
5,185,550 A * 2/1993 Morita et al. ............... 310/344
5,309,519 A * 5/1994 Park et al. .................. 381/190
5,479,521 A * 12/1995 D'Avolio et al. ........... 381/190
5,684,884 A * 11/1997 Nakaya et al. .............. 381/190
5,736,808 A 4/1998 Szilagyi et al.
5,868,485 A * 2/1999 Fujimori et al. ............ 353/119
6,154,890 A * 12/2000 Deopuria et al. ........... 381/370
6,195,440 B1 * 2/2001 Warnaka et al. ............ 381/191
6,345,102 B1 * 2/2002 Davis et al.
6,396,197 B1 * 5/2002 Szilagyi et al.

FOREIGN PATENT DOCUMENTS

JP U6344584 3/1988
JP A63175106 7/1988

* cited by examiner

*Primary Examiner*—Xu Mei
(74) *Attorney, Agent, or Firm*—Birch, Stewart, Kolasch & Birch LLP

(57) ABSTRACT

A speaker system is installed in a helmet, and includes a pair of piezoelectric speakers, frames supporting the speakers around the peripheral edges thereof, and laminated films for protecting the piezoelectric film speakers. Each of the frames has its longer sides curved with a radius of curvature of 210 mm to 360 mm in order to support the piezoelectric film speakers in a curved state similarly to the frame.

18 Claims, 6 Drawing Sheets

HELMET WITH BUILT-IN SPEAKER SYSTEM AND SPEAKER SYSTEM FOR HELMET

BACKGROUND OF THE INVENTION

1. Field of the Invention

The present invention relates to a helmet with a built-in speaker system and a speaker system for a helmet, and more particularly relates to a helmet with piezoelectric film speakers, and piezoelectric film speakers for a helmet.

2. Description of the Background Art

Magnetic speaker systems including a voice coil mounted on a cone have been widely used in helmets up to this time. However, such speaker systems are difficult to downsize or make light in weight. There has been a great demand for improved speaker systems for helmets. In order to attach a speaker system in the confined space of a helmet and make a user feel comfortable, the use of the piezoelectric film speakers has been proposed in Japanese Patent Laid-Open No. Sho 63-175106 and Japanese Utility Model Laid-Open No. Sho 63-44584.

The piezoelectric film expands and contracts in response to voltages applied to an electrode. Therefore, when applying the piezoelectric film to a speaker, it is necessary to convert expansion and contraction of the surface of the piezoelectric film into oscillations of the film surface. This requirement is satisfied by maintaining the piezoelectric film in a curved state, which enables the piezoelectric film to function as a speaker.

In such a case, output performance in response to input signals, i.e. sound pressure level and frequency characteristics of the piezoelectric film as a speaker, depends upon the relative relationship between the expansion-contraction, and the oscillation. This relative relationship depends upon the degree to which the piezoelectric film is curved, i.e. a radius of curvature of the curved portion of the piezoelectric film. Further, there is a limitation to the radius of curvature in order for which the piezoelectric film to perform in the required manner. If such a limitation is not observed and is exceeded, the piezoelectric film speaker cannot produce a sufficient sound pressure level or may have deteriorating frequency characteristics, so that the speaker cannot demonstrate the desired capacity and sound quality.

In the foregoing related art, no definite measures seem to have been taken in order to strictly keep the piezoelectric film curved in the predetermined range. Therefore, existing piezoelectric film speakers do not function satisfactorily.

SUMMARY OF THE INVENTION

The present invention is intended to overcome the foregoing problems of the related art and to provide piezoelectric film speakers for a speaker system to be used in a helmet. The present invention is also intended to provide a helmet including such piezoelectric film speakers which can function satisfactorily.

In order to accomplish the foregoing object, the present invention features the following:

(1) a speaker system is attached on an inner surface of a helmet and comprises a pair of piezoelectric film speakers which function as main surfaces, oscillate in response to an input signal and have their peripheral edges supported by frames;

(2) the frames support the piezoelectric film speakers in a curved state; and (3) the speaker system is attached on the inner surface of a helmet shell.

According to the first feature, the peripheral edge of each piezoelectric film speaker is held by the frame, which enables the piezoelectric film speaker to maintain its desired shape and posture without adversely affecting oscillation characteristics of the main surface thereof.

In the second feature, each frame is designed in accordance with a desired shape of the piezoelectric film speaker (i.e. a three-dimensional shape or a curved state of the piezoelectric film speaker), which allows the piezoelectric film speaker to be fixedly attached in the desired curved state without adversely affecting the oscillation characteristics of the main surface.

With the third feature, the speaker system is not attached to an interior member such as an elastic liner which is easily aged but is attached to the hard helmet shell which is substantially free from aging. Therefore, the speaker system is reliably attached to the helmet in the desired posture.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION OF THE PREFERRED EMBODIMENTS

The invention will be described with reference to preferred embodiments shown on the accompanying drawings. The helmet 1 includes a thin hard helmet shell 11 made of a fiber-reinforced plastic material, for example. A head liner 121A is attached on an inner surface of the helmet shell 11 and made of foamed styrene. A head inner part 12A is detachably attached to the head liner 121A using a hook-and-loop fastener such as VELCRO or the like. An ear inner part 12B and a chin inner part 12C are detachably attached together with a liner 121 to the inner surface of the helmet shell 11. A chin strap 13 is connected to the helmet shell 11.

Figure 1:
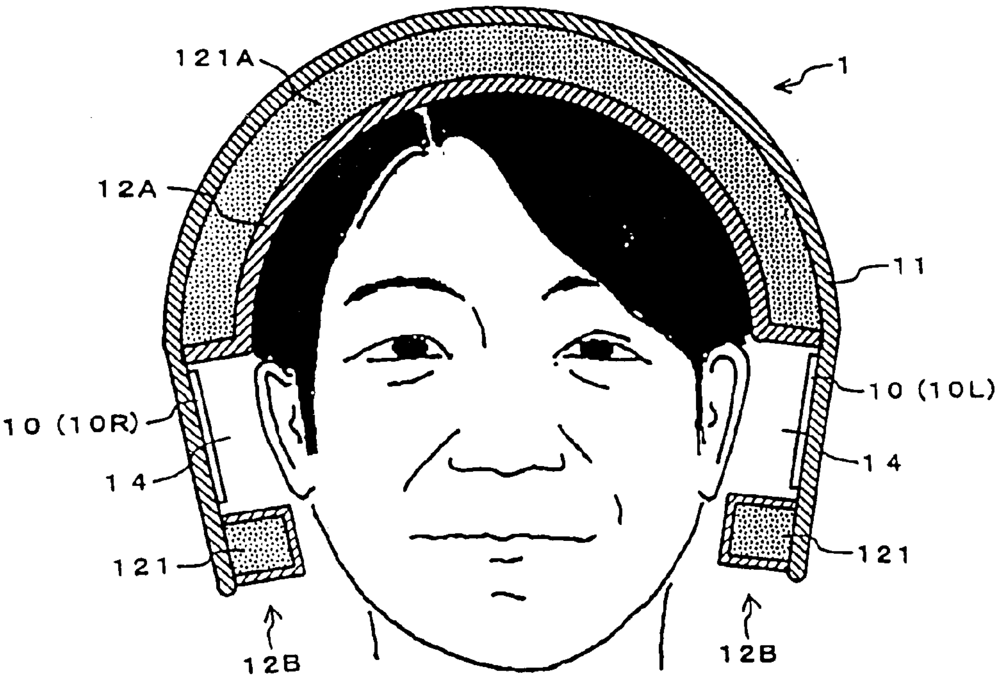
FIG. 1 is a sectional view of the helmet including the speaker system according to a first embodiment of the invention.
Figure 2:
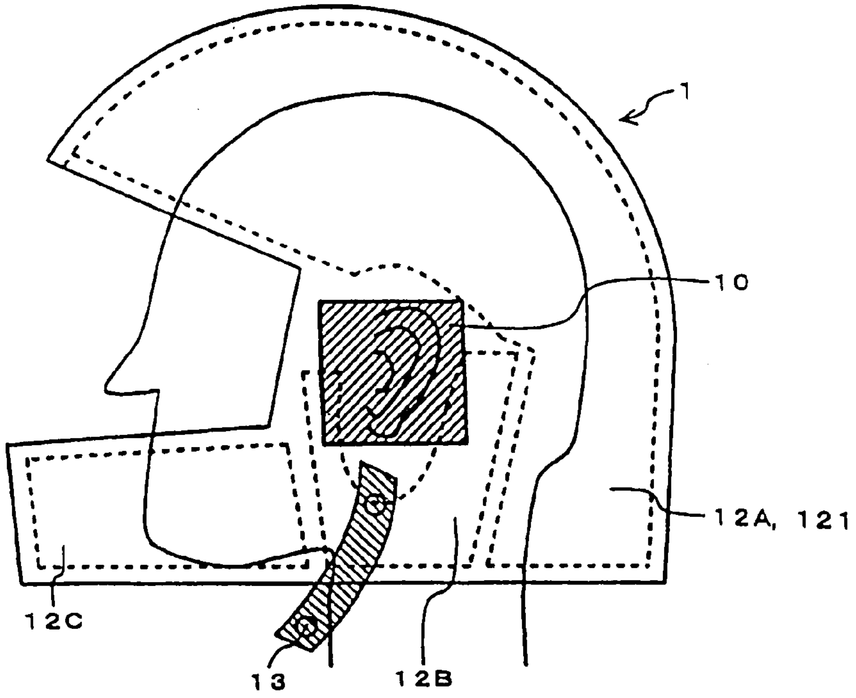
FIG. 2 is a side view of the helmet of FIG. 1.
Figure 3:
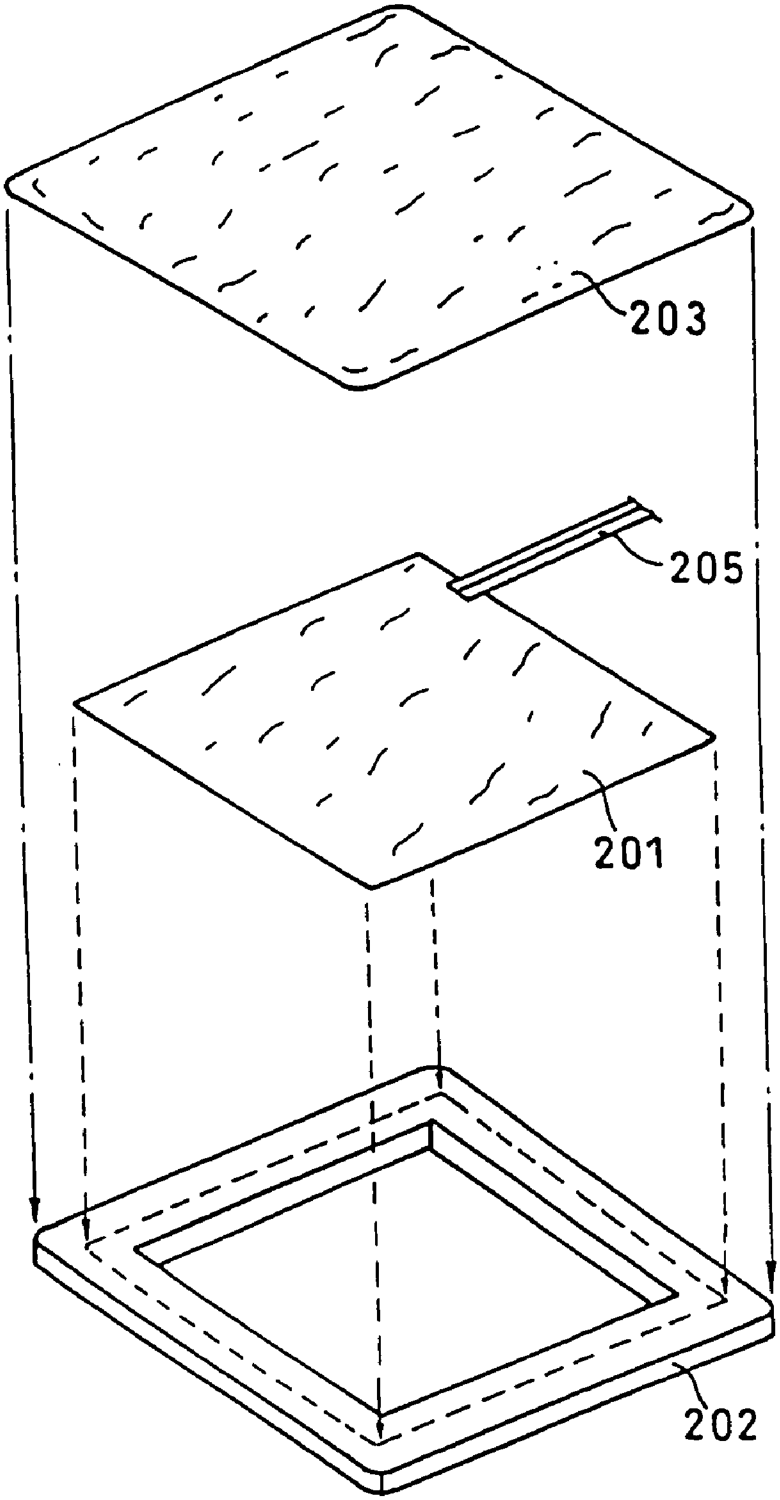
FIG. 3 is an assembly drawing of the piezoelectric film speaker of the first embodiment.
Figure 4:
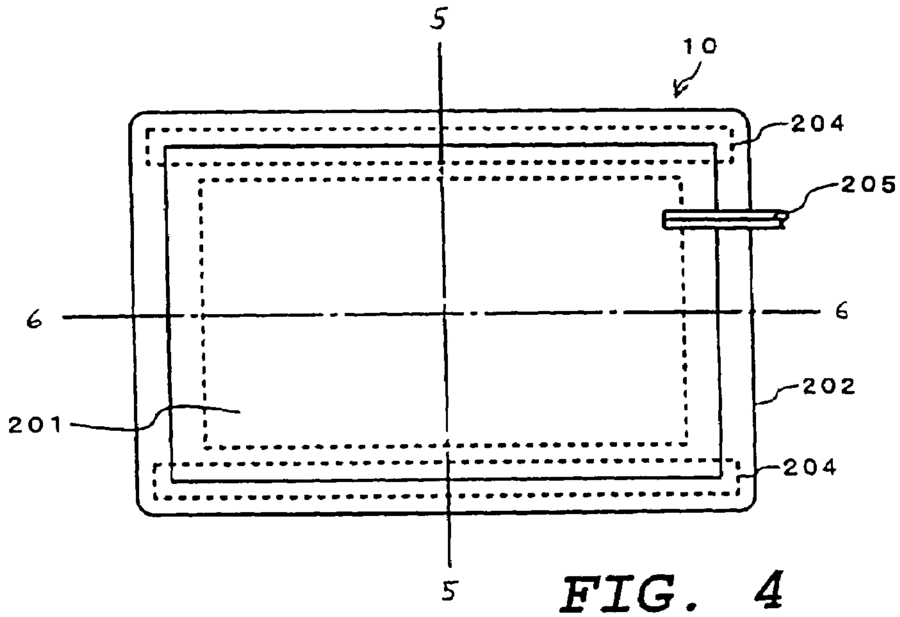
FIG. 4 is a front view of the piezoelectric film speaker.

Referring to FIG. 2, the ear inner part 12B (including the liner 121) is in the shape of a letter U or in the shape of a ring in order to maintain a predetermined space around the ears to prevent the ears from being pressed and protecting the sides of a user's head against the helmet. Further, the head liner 121A and head the inner part 12A thereof are shaped such that they do not come into contact with the user's ears.

A speaker system 10 includes a pair of left and right speakers 10L and 10R which are detachably attached to the inner surface of the helmet shell 11 in a space 14 defined by the foregoing liners, using a fastener such as the hook-and-loop fastener VELCRO. According to the invention, the speaker system 10 is directly attached to the hard helmet shell 11 which is substantially free from aging, rather than the elastic liner 121 (or the head inner part 12A) which tends to age extensively. Therefore, the speaker system 10 can be reliably attached in the predetermined posture.

Figure 5:
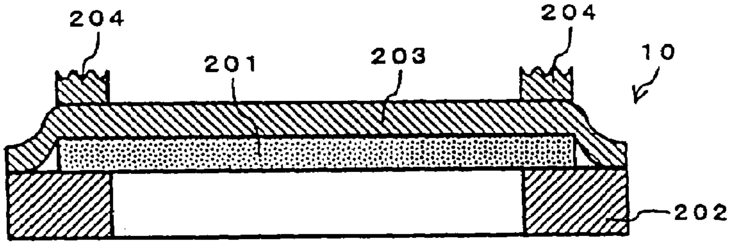
FIG. 5 is a sectional view of the piezoelectric film speaker taken along line 5—5 of FIG. 4.

The speaker system 10 includes a pair of piezoelectric film speakers 201 made of polyvinylidene fluoride (PVDF) or the like, frames 202 for supporting the piezoelectric film speakers 201 around their peripheral edges, and laminated films 203 for protecting the piezoelectric film speakers 201, all of which are laid over one after another as shown in FIG. 5. Hook-and-loop fasteners 204 such as VELCRO are stuck along opposite side edges of the laminated films 203 in order to attach the speaker system 10 onto the inner surface of the helmet shell 11 in the spaces 14 defined by the liner 121. Electrode wiring 205 is connected to each piezoelectric film speaker 201.

Each of the frames 202 is made by shaping a moisture-proof and shock-resistant material such as nylon, polyethylene or polypropylene, or thick paper with a moisture-proof coating. In the invention, the piezoelectric film speaker 201 has its peripheral edge fixedly supported by the frame 202, and can be reliably and firmly maintained in the desired posture. Therefore, it is possible to provide the speaker system 10 with the desired performance.

Figure 6:
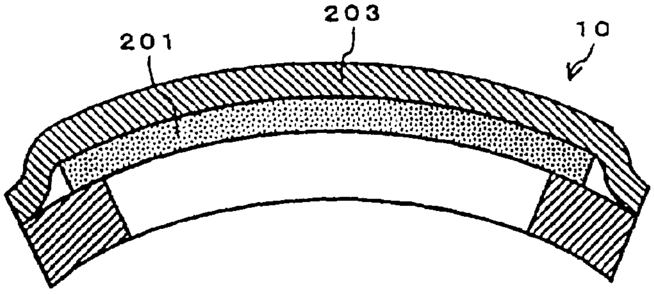
FIG. 6 is a sectional view of the piezoelectric film speaker taken along line 6—6 in FIG. 4.

Further, the frame 202 has its longer sides curved with a radius of curvature of approximately 210 mm to 360 mm in order to curve the piezoelectric film speaker 201 with the predetermined radius of curvature (of approximately 210 mm to 360 mm), as shown in FIG. 6 in an exaggerated state. The shorter sides of the frame 202 (shown in FIG. 5) may be flat or be slightly curved with a radius of curvature of approximately 500 mm.

According to the invention, the frames 202 are curved as described above, so that the piezoelectric film speakers 201 can be reliably maintained in the curved state without adversely affecting the oscillation thereof. This enables the piezoelectric film speakers 201 to output sound and voice-audio with excellent quality and sufficient pressure. The speaker system 10 is detachably attached to the helmet 1 using the hook-and-loop fasteners 204, so that it can be used with a desired helmet if the user has a plurality of helmets, or can be easily attached to a new helmet.

Figure 7:
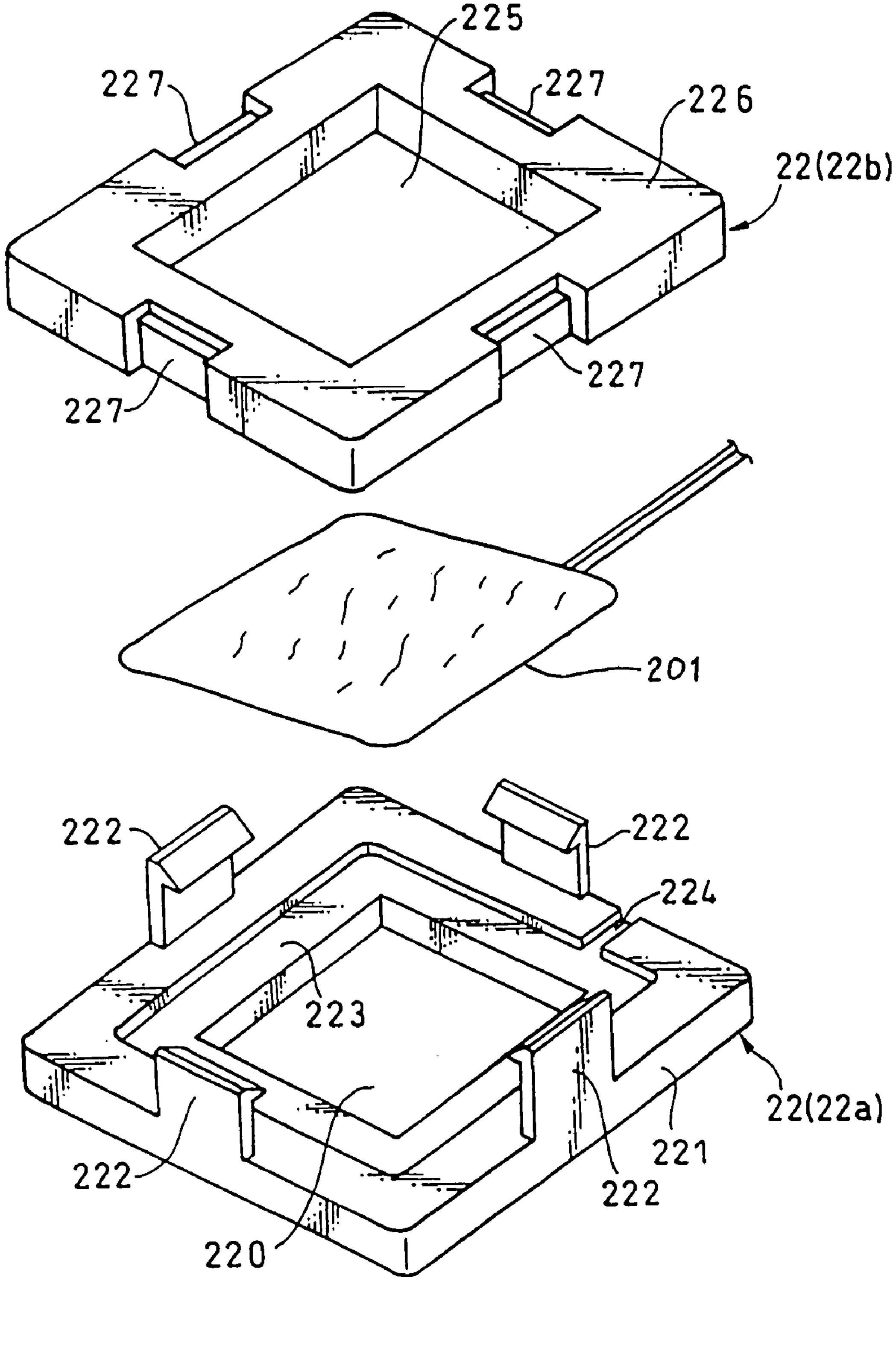
FIG. 7 is an assembly drawing of the piezoelectric film speaker according to a second embodiment.

FIG. 7 is an assembly drawing of a second embodiment of the speaker system which comprises a pair of piezoelectric film speakers 201, and frames 22 for supporting the piezoelectric film speakers 201 along their peripheral edges. The speaker system 10 is detachably attached to the inner surface of the speaker shell 11 using the hook-and-loop fastener (Velcro—not shown) as in the first embodiment.

Each frame 22 includes a pair of a frame piece 22*a* (at the shell side) and a frame piece 22*b* (at the ear side) which are joined with to each other. The piezoelectric film speaker 201 has its peripheral edge sandwiched between and held by the frame pieces 22*a* and 22*b* with some play therebetween.

The frame piece 22*a* includes a body 221 having a center window 220, four claws 222 provided at the centers of four sides of the body 221, a thin film-receiving portion 223 formed along the inner edge of the body 221, and a run-off portion 224 located on the body 221 in order to receive a lead wire 205.

The frame piece 22*b* includes a body 226 having a center window 225, four recesses 227 provided at the centers of four sides of the body 225 for engagement with the four claws 222, and a thin film-receiving portion 228 (see FIG. 8) formed along the inner edge of the body 226.

The speaker system 10 is assembled as follows: the piezoelectric film speaker 201 is placed in the film-receiving portion 223 of the frame piece 22*a*, the lead wire 205 is made to pass through the run-off portion 224, the frame piece 22*b* is engaged with the frame piece 22*a*, and the four claws 222 on the frame piece 22*a* are engaged with the four recesses 227 on the frame piece 22*b*.

Figure 8:
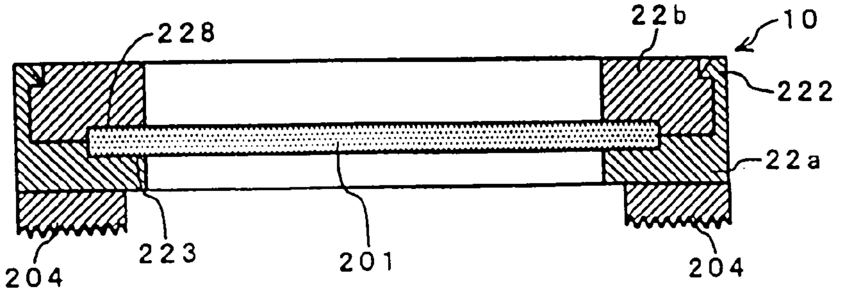
FIG. 8 is a sectional view of the piezoelectric film speaker of the second embodiment.
Figure 9:
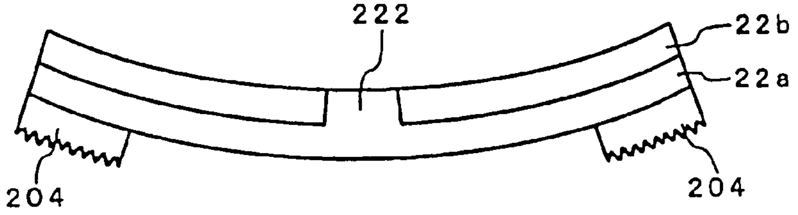
FIG. 9 is a side view of the piezoelectric film speaker in the second embodiment.

Although not clearly shown in FIGS. 7 and 8, the frame 22 (composed of the frame pieces 22*a* and 22*b*) is curved at least in one of two directions which are orthogonal with each other. Therefore, the piezoelectric film speaker 201 supported by the frame 22 is also curved with the radius of curvature substantially identical to that of the frame 22 (ideally the radius of curvature being 210 mm to 360 mm). In other words, the frame 22 is curved in accordance with the desired curved state of the piezoelectric film speaker 201.

Figure 10:
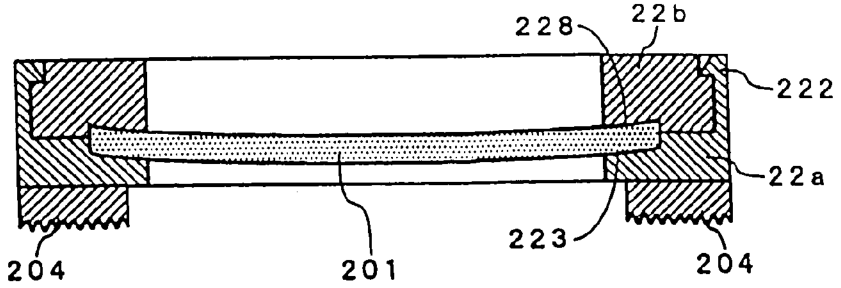
FIG. 10 is a sectional view of the piezoelectric speaker in a modified example of the second embodiment.

Alternatively, the piezoelectric film speaker 201 may be curved as shown in FIG. 10. In this case, the frame 22 is flat, but the film-receiving portion 223 has a varying depth so that the piezoelectric film speaker 201 may be supported in a curved state.

The second embodiment is advantageous in the following respects in addition to the advantages of the first embodiment. Each piezoelectric film speaker 201 is sandwiched between and held by a pair of frame pieces 22*a* and 22*b* which are joined to each other. This structure enables easy and efficient assembling of the speaker system 10. Further, the user can replace a broken piezoelectric film speaker 201 with a new one without any problem.

Further, even when the frame 22 is not applicable to a helmet on hand because of the size or shape thereof, the piezoelectric speaker 201 can be used commonly for a plurality of helmets simply by obtaining a compatible frame 22.

Figure 11:
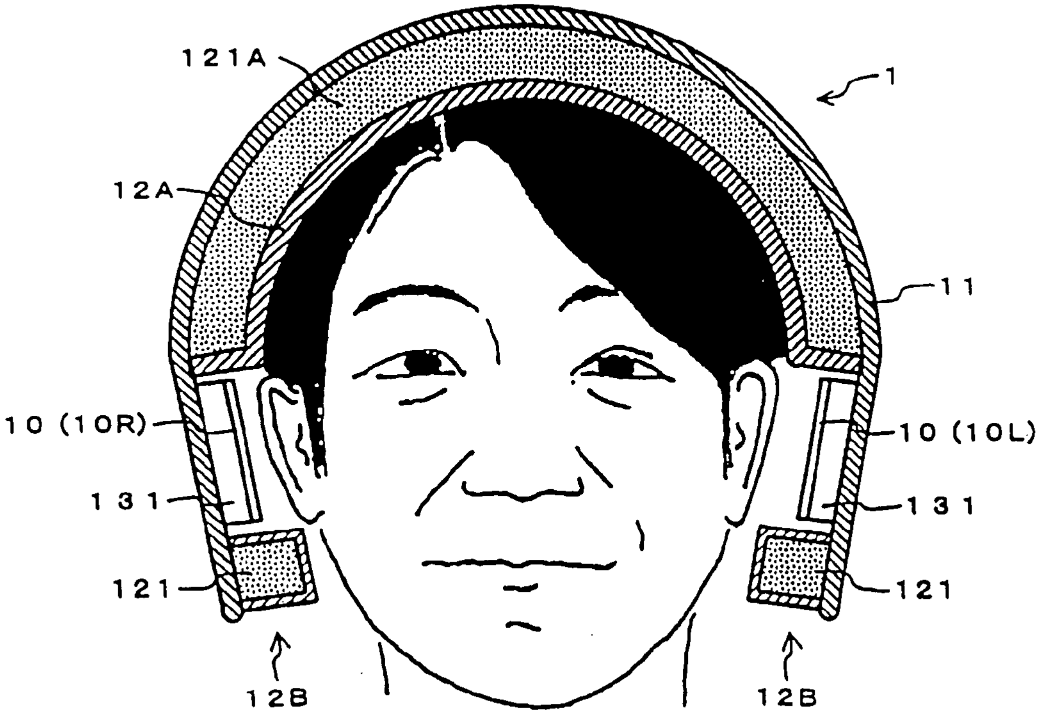
FIG. 11 is a sectional view of the helmet with the built-in speaker system in the second embodiment.
Figure 12:
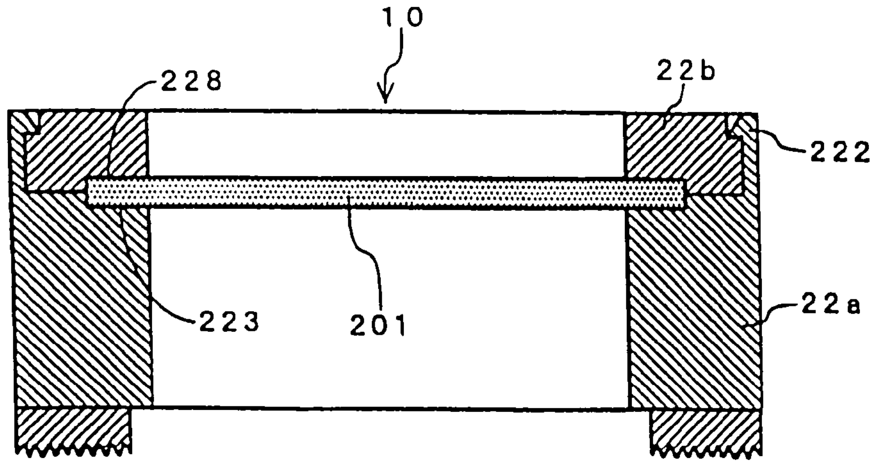
FIG. 12 is a sectional view of the piezoelectric film speaker in a further modified example of the second embodiment.

In the foregoing embodiments, the speaker system 10 is assumed to be directly attached to the inner surface of the helmet shell 11. Alternatively, the speaker system 10 may be positioned near the user's ears regardless of a size or shape of a helmet, when the speaker system 10 is attached using spacers 131 having an appropriate thickness, as shown in FIG. 11. In such a case, the user may enjoy an increased sound pressure level, compared with when the speaker system 10 is directly attached to the helmet shell.

In place of raising the position of the speaker system 10 using the spacer 131, the frame piece 22*a* may be thickened, which is as effective as in the case of using the spacers 131. In other words, if a plurality of frame pieces 22*a* which are different in thickness are prepared, then an optimum frame piece 22*a* may be selected depending upon the size or shape of the helmet, and be used together with the frame piece 22*b*.

The invention can assure the following advantages:

(1) the piezoelectric film speakers can be reliably and firmly maintained in the desired shape and posture, so that the speaker system can assure excellent performances;

(2) the piezoelectric film speakers can be reliably maintained in the curved state, so that the speaker system can output sound with sufficient quality and pressure;

(3) each of the piezoelectric film speakers is sandwiched between and held by a pair of the frame pieces, which facilitates assembling of the speaker system, and improves productivity;

(4) this structure enables the user to easily replace a broken piezoelectric film speaker with a new one;

(5) even if the frame cannot be applied to helmets with different sizes and shapes, the user can attach the speaker system to his or her helmet on hand simply by obtaining a compatible frame, and therefore the piezoelectric film speaker is applicable to a plurality of helmets;

(6) the speaker system is attached to the helmet shell made of a hard material which is free from aging rather than to a liner or an interior member made of an elastic material which tends to age extensively, and therefore the speaker system can be reliably and firmly maintained in the predetermined posture; and (7) the speaker system is attached to the helmet using a detachable fastener such as VELCRO or the like, and can be easily attached to any helmet if the user has a plurality of helmets or when the user uses a new helmet.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A piezoelectric speaker, comprising:

a frame having an opening therein, the opening extending between a back surface and a front surface of the frame;

a piezoelectric film having a back surface area larger than the opening in said frame, the piezoelectric film being located on said back surface of said frame and covering said opening;

a laminating film having a central portion and a peripheral portion, the central portion covering and protecting an entire back surface of said piezoelectric film, and the peripheral portion extending beyond all sides of the piezoelectric film for covering and protecting sides edges of the piezoelectric film that are perpendicular to the back surface, and for attaching to peripheral portions of said back surface of said frame; and a fastener secured to said laminating film at a position overlapping edges of the piezoelectric film but not overlapping the opening, the fastener for detachably fastening a back side of said piezoelectric speaker to an exposed inner surface of a shell of a helmet, and a front side of the piezoelectric film being exposed.

2. The piezoelectric speaker according to claim 1, wherein said fastener is a hook-and-loop fastener.

3. The piezoelectric speaker according to claim 1, wherein said frame is substantially rectangular.

4. The piezoelectric speaker according to claim 1, wherein the fasteners are formed as hook-and-loop fastener strips on outer sides thereof and are stuck on opposite sides thereof on portions of the laminated film not overlapping the opening of the frame.

5. The piezoelectric speaker according to claim 1, wherein an outer edge of the laminated film extends beyond the fasteners to an outer edge of the frame.

6. A speaker system for attachment to an inner surface of a helmet, said speaker system comprising:

a piezoelectric film speaker functioning as a main surface, oscillating in response to an input signal and having a peripheral portion thereof, an ear side frame and a shell side frame piece which clamp together over back and front surfaces of the peripheral portion of the piezoelectric film, the shell side frame piece having multiple claws, each of the claws having a solid plate-shaped portion extending orthogonally to ear side and shell side surfaces of the shell side frame, and an inward extending portion extending inward toward a center of the shell side frame, the claws capable of holding the piezoelectric film speaker between the frame pieces when the claws are clamped into L-shaped recesses formed on edges of the ear side frame piece, and the claws being capable of releasing the piezoelectric film speaker from between the frame pieces when the claws are unclamped from the L-shaped recesses formed on the edges of the other of the frame pieces, the ear side frame piece and the shell side frame piece each having a center opening, the center openings extending through the frame pieces and exposing a central portion of a front side of the piezoelectric film to a person's ear, and the piezoelectric film speaker being supported by the frame pieces, wherein an electrode wiring connects to the piezoelectric film speaker and passes through a runoff portion formed in an edge of the frame.

7. The piezoelectric speaker according to claim 6, one of said pair of joined frame pieces including a film-receiving recess for receiving said piezoelectric film therein.

8. The speaker system of claim 6, wherein the frame pieces support the piezoelectric film speaker in a curved state.

9. The helmet including the speaker system defined in claim 6, said speaker system being fixedly attached on an inner surface of a shell of said helmet.

10. The helmet of claim 9, wherein the speaker system is fixedly attached on the inner surface of the helmet shell using a detachable fastener.

11. The helmet including the speaker system defined in claim 6, wherein the frame pieces are detachable from one another in order to replace the piezoelectric film speaker.

12. A piezoelectric speaker, comprising:

a curved frame having an opening therein, the opening extending between a back surface and a front surface of the frame;

a piezoelectric film having a surface area larger than the opening in said frame and having width and length dimensions smaller than width and length dimensions of the frame, the piezoelectric film being centrally located on said back surface of said frame and covering said opening but not covering portions of the back surface of the frame adjacent to a perimeter of the frame, the piezoelectric film being supported by the curved frame and having a radius of curvature substantially equal to a radius of curvature of the frame;

a laminating film for covering and protecting the back surface and outer edges of said piezoelectric film, the laminating film having width and length dimensions greater than the width and the length dimensions of the piezoelectric film and extending over and attaching to the portions of the back surface of the frame adjacent to the perimeter of the frame; and a fastener secured to said laminating film at a position overlapping edges of the piezoelectric film but not overlapping the opening, the fastener for detachably fastening a back side of said piezoelectric speaker to an exposed inner surface of a shell of a helmet, and a front side of the piezoelectric film being exposed.

13. The piezoelectric speaker according to claim 12, wherein said frame is substantially rectangular.

14. The piezoelectric speaker according to claim 13, wherein said frame has a length dimension and width dimension, said length dimension being larger than said width dimension, and wherein said frame is curved along said length dimension.

15. The piezoelectric speaker according to claim 14, wherein a curvature of said frame has a radius of curvature in a range of 210 mm to 360 mm.

16. The piezoelectric speaker according to claim 12, wherein said fastener is a hook-and-loop fastener.

17. The piezoelectric speaker according to claim 12, wherein the fasteners are formed as hook-and-loop fastener strips on outer sides thereof and are stuck on opposite sides thereof on portions of the laminated film not overlapping the opening of the frame.

18. The piezoelectric speaker according to claim 12, wherein an outer edge of the laminated film extends beyond the fasteners to an outer edge of the frame.

* * * * *